United States Patent [19]

Delio et al.

[11] Patent Number: 4,463,637

[45] Date of Patent: Aug. 7, 1984

[54] METHOD AND APPARATUS FOR TRIMMING FORGINGS

[76] Inventors: Ralph D. Delio, R.D. #1 Susan Trace, New Wilmington, Pa. 16142; Donald J. Diemer, 4355 Brendan La., North Olmsted, Ohio 44070

[21] Appl. No.: 433,229

[22] Filed: Oct. 7, 1982

Related U.S. Application Data

[63] Continuation-in-part of Ser. No. 297,741, Aug. 31, 1981, Pat. No. 4,425,779, which is a continuation of Ser. No. 002,851, Jan. 12, 1979, Pat. No. 4,294,101.

[51] Int. Cl.³ .............................................. B26F 1/14
[52] U.S. Cl. ........................................ 83/40; 83/55; 83/456; 83/621; 83/914; 83/923
[58] Field of Search ...................... 83/55, 40, 50, 452, 83/382, 454, 456, 621, 914, 923, 667

[56] References Cited

U.S. PATENT DOCUMENTS 2,411,399 11/1946 Walpole ............................ 83/621 X Primary Examiner—James M. Meister
Attorney, Agent, or Firm—Fay & Sharpe

[57] ABSTRACT

A forging (A) is received in a split ring (B) which provides peripheral support to a forging peripheral wall (14) and an upper peripheral flange (16). The forging and the split ring are supported by a nest member assembly (C) as a trimming assembly (D) moves longitudinally to trim the forging flange and a forging bore (10). A punch (74) with a hardened cutting edge (80) moves axially through the forging bore and interacts with a nesting assembly cutting edge (60) to trim the bore. Concurrently, a trim die (90) having a cutting edge (96) interacts with a split die cutting edge (36) trimming the upper flange. The split ring restrains a central portion of the forging from puffing peripherally outward in response to the punch being urged therethrough. The interaction of the trim die and the split ring inhibits the upper part of the forging adjacent the upper flange from being drawn in toward the forging bore by the interaction between the punch and forging. In this manner, the forging bore and flange are trimmed concurrently and deformation of the forging is restrained.

20 Claims, 8 Drawing Figures

METHOD AND APPARATUS FOR TRIMMING FORGINGS

BACKGROUND OF THE INVENTION

This application is a continuation-in-part of application Ser. No. 297,741 filed Aug. 31, 1981, now U.S. Pat. No. 4,425,779, which in turn is a continuation of application Ser. No. 2,851, filed Jan. 12, 1979, now U.S. Pat. No. 4,294,101.

The present application pertains to the art of trimming and, more particularly, to the art of trimming flashings from forgings. The invention finds particular application in concurrently trimming flashings from a central bore and a peripheral flange of forged rollers, wheels, and the like. However, it is to be appreciated that the invention may be used for trimming other forgings and finds particular application in trimming forgings which are conducive to concurrent, multiple trimming operations.

Heretofore, to forge a roller or wheel, a heated billet was placed within a die cavity which conformed generally to the periphery of the wheel or roller to be forged. Commonly, the die cavity defined a first peripheral flange at one end, a perphieral mud groove centrally disposed, a second peripheral flange at the other end, and other peripheral characteristics of the roller or wheel. A moveable die or mandrel with an elongated displacement member was urged into an axial portion of the heated billet. Movement of the displacement member not only created a bore through the billet but forced the billet into conformity with the die cavity. A gap between the stationary die cavity and the moveable die to allow excess metal to flow from the die cavity caused a flashing peripherally around the second flange. Commonly, the diametric dimensions were forged and machined generally within a tolerance of minus 0 to plus 1.5 to 2 mm.

The displacement member did not pass cleanly and completely through the billet. Rather, a flashing was left in the internal bore. To facilitate removal of the displacement member, the displacement member was commonly tapered which created a corresponding taper in the internal forging bore. Further, the second flange which was formed with a thick peripheral flashing.

To remove the flashings from the central bore and the second flange, the forging was positioned on a nesting member having a matching bore. A punch was driven through the central bore of the forging and into the bore of the nesting member. In this manner, the flashing was cleared from the central bore and the central bore trued. The roller or wheel was inverted and positioned with the second flange supported on an anvil member. A trimming die coacted with the anvil member to trim the second flange to the selected diameter.

One of the problems with the prior art trimming methods and apparatus is that they tended to deform the forging. During trimming, the forgings were still hot, hence relatively soft. As the punch engaged the upper part of the central bore, the forging tended to compress axially and puff outward around its central and lower periphery. Further, as the punch moved through the bore, there was a tendency to pull the upper part of the forging axially with a resultant radial deformation inward toward the bore. This caused a diametric deformations of 1 to 2 mm or more.

The trimming deformation combined with the forging tolerance variation produced a resultant product whose tolerances where outside the generally accepted tolerance range. A subsequent machining operation was normally performed to adjust the tolerances.

The present invention contemplates a new and improved method and apparatus for trimming forging which reduces forging deformation sufficiently that the subsequent tolerance adjusting machining operation can be eliminated.

SUMMARY OF THE INVENTION

In accordance with one aspect of the present invention there is provided a method for concurrently trimming flashings from an outer surface and an internal bore of a forging. The forging is received in a split ring and the forging and split ring are positioned together on a nest member assembly. A punch moves through the forging bore while the split ring engages the forging to restrain at least a portion of the forging from puffing outward due to the interaction between the punch and the forging. Concurrently with the movement of the punch, a trim die trims the outer forging flashing. In this manner, the interaction between the trim die and the outer forging flashing restrains the flashing from being drawn inward toward the forging bore by the concurrent interaction of the punch and forging.

In accordance with another aspect of the invention, there is provided an apparatus for simultaneously trimming a peripheral flashing and an internal bore of a forging. A split ring receives and peripherally supports the forging. A nest member assembly is configured to support the forging and the split ring. A punch is disposed for longitudinal movement through the forging bore. A split ring is disposed for longitudinal movement simultaneously with the punch to trim the peripheral forging flashing.

A primary advantage of the present invention is that it restrains deformation of forgings during the trimming.

Another advantage of the present invention is that it reduces or eliminates machining and other finishing operations on the forged product.

Another advantage of the present invention is that it produces a forging of selected diametric dimensions with a tolerance of less than 2 mm.

Yet another advantage of the present invention is that it reduces trimming operations and labor.

Still further advantages of the present invention will become apparent to others upon reading and understanding the following detailed description of the preferred embodiment.

BRIEF DESCRIPTION OF THE DRAWINGS

The invention may be embodied in various steps and arrangements of steps and in various parts and arrangements of parts. The drawings are for purposes of illustrating a preferred embodiment of the invention and are not to be construed as limiting it.

FIG. 3 is a top view of the split ring of FIG. 2;

FIG. 4 is a sectional view of trimming apparatus in the act of trimming a received forging;

FIG. 5 is a plan view of the trim die of FIG. 4;

FIG. 6 is a sectional view through section 6—6 of FIG. 5;

FIG. 7 is a sectional view of the roller of FIG. 1 after the flashings have been trimmed; and, FIG. 8 is a sectional view of an alternate embodiment of a split ring in accordance with the present invention.

DETAILED DESCRIPTION OF THE PREFERRED AND ALTERNATE EMBODIMENT

Figure 1:
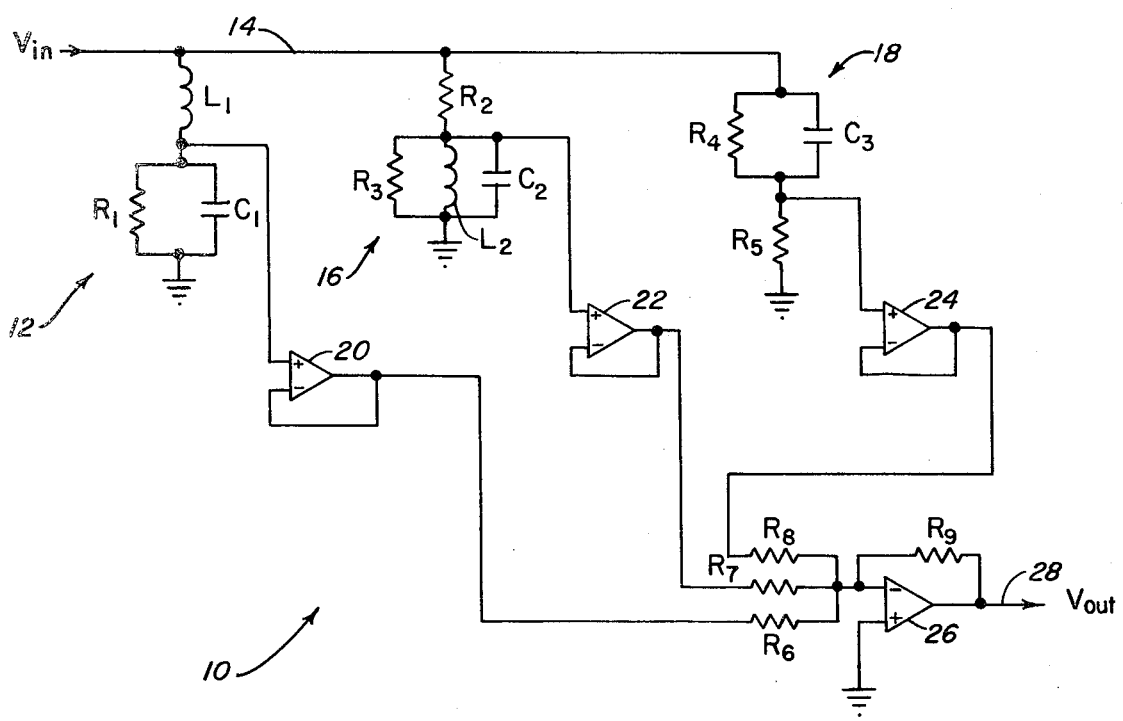
FIG. 1 is a sectional view of a forging including the flashings formed during the forging process with exaggerated deformations of the type caused in trimming illustrated in phantom.

With reference to FIG. 1, a forging A which is to be trimmed with the apparatus or method of the present invention includes an internal passage or bore 10 having a flashing 12 therein. Typically, the bore is formed with a tapered mandrel to facilitate its withdrawal which imparts a like taper to the forging bore. The forging includes an outer peripheral surface 14 which defines at least a first flange 16. As the mandrel displaces metal, excess metal which defines a peripheral extension or flashing 18 around the first flange 16 is trimmed. In the preferred embodiment the forging A is a roller. The forging peripheral surface 14 includes a second flange 20, a pair of secondary flange 22 and 24, and a mud groove 26. If a punch, illustrated in phantom, were to be urged through the bore, interaction with the bore flashing would tend to enlarge or puff the portion of the forging around flange 24 outward, illustrated at 27 to an exaggerated degree in phantom. Further, the drag of the punch along the bore surface would tend to draw the top part of the forging into the bore, illustrated at 29 to an exaggerated degree in phantom.

Figure 2A:
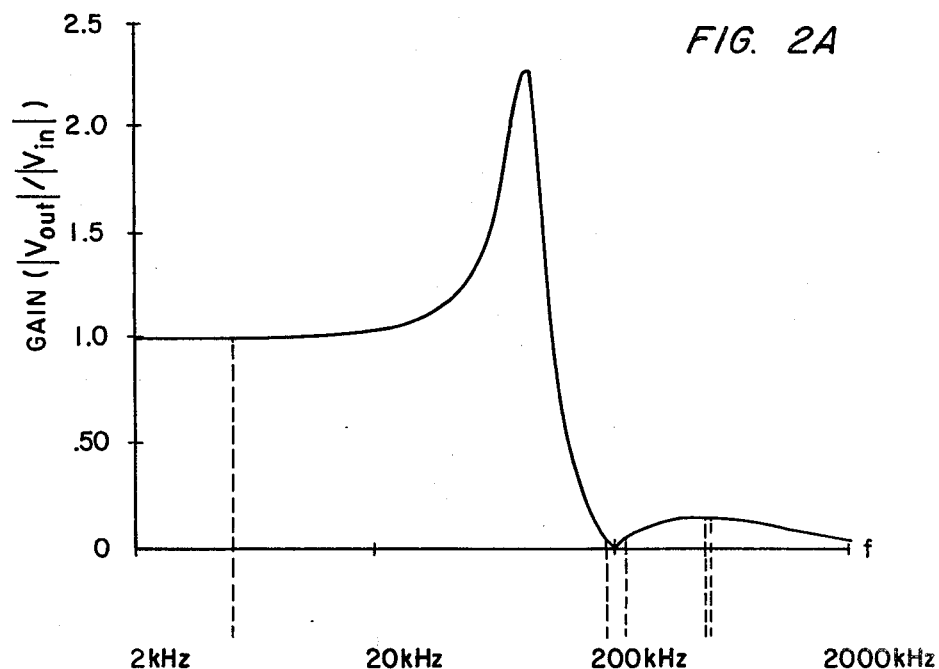
FIG. 2 is an elevational view in partial section of a split ring surrounding a forging which is being positioned on a nesting member assembly.
Figure 2B:
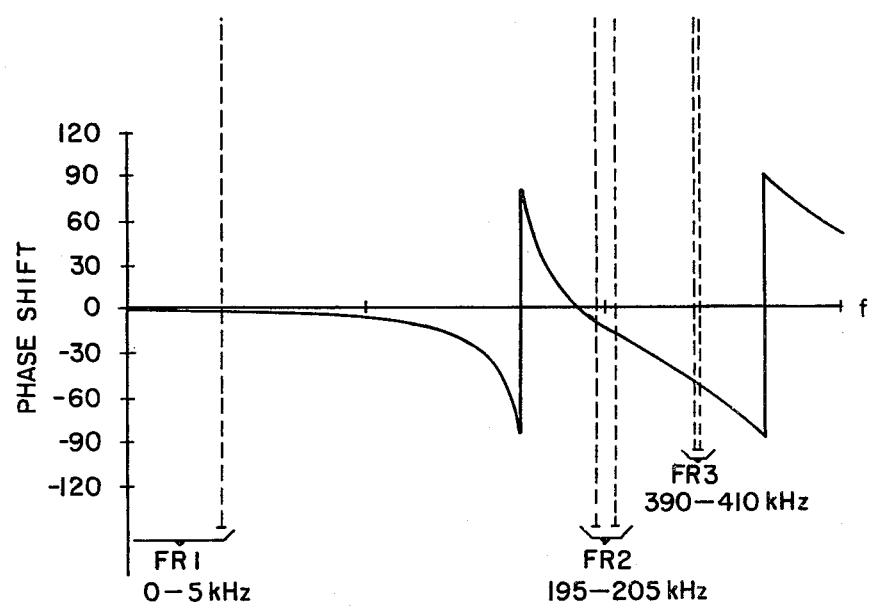

With reference to FIG. 2, the forging A is received and supported by a split ring B while it is still hot and relatively soft from the forging operation. The split ring and forging are positioned in a nesting member assembly C to be supported thereby as a trimming assembly D (FIG. 4) trims the forging bore and flange flashings.

With particular reference to FIGS. 2 and 3, the split ring B includes a pair of split ring halves 30a and 30b which are hingedly interconnected by a tong assembly 32. Like elements of the split ring halves 30a and 30b are denoted by the same reference numeral but followed by the suffixes a and b, respectively. Each split ring half includes a flange supporting surface area 34 which terminates at its outer peripheral edge with a ring of hardened cutting material, such as a stellite weld 36. The annular cutting edge 36 is flush with a peripheral guide surface 38 which precisely matches the selected outer contour, i.e. diameter, to which the flange is to be trimmed. Specifically, the dimension is selected such that the upper flange 16 is within the same tolerance of the selected diameter as the forged bottom flange 20. The split ring includes an annular projection or ledge 40 which is adapted to be supported by the nesting assembly C during the trimming operation. An inner peripheral forging supporting surface firmly engages the peripheral surface 14 of the forging to restrain it from puffing or otherwise being enlarged outward during the trimming operation. In the preferred embodiment, the forging supporting surface includes a central cylindrical wall portion 42 which engages the secondary flanges 22 and 24 and a pair of end cylindrical wall portions 44 and 46 which engage the roller adjacent the first and second flanges. The inner forging support surface accurately matches the selected diametric dimensions of the roller to constrain the rollers from being deformed beyond the selected forging tolerances. As explained in greater detail below in conjunction with the trimming assembly, each peripheral guide surface 38 extends longitudinally into a guide surface recess 48.

With reference to FIGS. 2 and 4, the nest member assembly C includes a die set shoe 50 which is adapted to be bolted or otherwise fastened with a stationary press die set or work support. A nest base 52 is received in a mating recess in the die set shoe. A nest cap 54 is received in a mating well in the nest base. The nest cap include a forging supporting surface 56 which mates the contour of the lower forging end to provide support thereto. A nest assembly aperture 58 which is defined through the nest assembly forging supporting surface 56 in axial alignment with the forging bore is surrounded by an annular cutting ring 60, such as a stellite weld. The annular cutting ring matches the diameter of the desired forging bore. The nest assembly further includes an annular split ring supporting ledge 62 for supporting the split ring B by its lower supporting ledge 40.

With continued reference to FIG. 4, the moveable trimming assembly D includes a die set punch holder 70 which is mounted on the moveable heading slide of a mechanical or hydraulic press for longitudinal movement therewith. A drum 72 mounts a punch 74 to the die set punch holder. A banjo 76 is connected with a spacing cylinder 78 which selectively engages the upper surface of the flange 16 being trimmed. As the upper die set punch holder 70 and the die set shoe 50 are moved toward each other, a hardened stellite cutting edge 80 of the punch 74 moves through the forging bore 10. This removes the flashing 12 from the bore and trues the forging bore to a more perfect cylindrical surface. More specifically, the punch hardened cutting edge 80 and the nest assembly cutting ring 60 interact in a cutting action to trim the flashing from the forging bore.

With continued reference to FIG. 4 and further reference to FIGS. 5 and 6, an annular trim die 90 is operatively connected with the die set punch holder 70 to undergo longitudinal movement concurrently with the punch 74. The trim die may be directly connected with the punch holder for motion with the punch. Alternately, because the trim die engages the forging during trimming with a shorter movement, it may be indirectly connected with the punch holder. The trim die includes a pair of projecting flashing splitting blades or means 92 and 94. The flashing splitting blades have hardened cutting edges which move through the flange flashing splitting it into at least two parts. The splitting blades move adjacent the split ring cutting edge 36, along the guide surface 38, and into the guide surface recesses 48. In this manner, the annular flashing divides and falls free from the forging and split ring. The trim die is annular with a hardened cutting edge 96 around an inner, circular periphery. The trim die cutting edge is the same cross section as the split ring outer guiding surface 38 such that the trim die is adapted to slide longitudinally therealong. The trim ring cutting edge 96 is fashioned with sufficient precision that its cutting interaction with the split ring cutting edge 36 trims the upper flange 16 to the selected dimension within the same tolerance as the lower flange 20. In this manner, the annular trim die cutting edge 96 and the split ring cutting edge 36 interact in a cutting relationship to trim the flashing 18 from the flange 16 of the forging within close, selected tolerances, preferably 1.5 mm.

After the punch and trim die have severed the flashings from the bore and flange of the forging, the die set punch holder and die set shoe are moved apart with-drawing the punch and trim die. The split ring and forging are removed from the nest assembly and the split rings opened to remove the forging. With reference to FIG. 7, after the trimming operation, the forging has a central bore 10 which is uniformly cylindrical through the forging and matching upper and lower flanges 16 and 20. The upper flange is trimmed to the selected diameter and the lower flange is forged to the same selected diameter.

In FIG. 8, an alternate embodiment of the split ring die is illustrated. In the embodiment of FIG. 8, like elements with the embodiment of FIGS. 2 and 3 are denoted with the same reference numerals but followed by a prime ('). The split ring includes an upper cutting ring 36' along a trim die guiding surface 38'. A central portion of the inner peripheral forging support surface 42' includes an annular projection 100 which conforms to the cross section of the mud ring 26. A pair of annular recesses 102 and 104 which conform to the annular rings 22 and 24 of the forging. In this manner, the inner peripheral forging supporting surface of the split ring conforms more accurately with the peripheral surface of the forging to provide better support against puffing or other deformation of the hot forging during the trimming operation.

In operation, the punch moves through the central bore to engage metal around the periphery of the bore and cut at least the flashing 12 free. The interaction between the punch and the heat softened forging has a tendency to deform the forging. Specifically, the interaction of the punch and bore tends to compress or otherwise urge the portion of the forging directly adjacent the bore longitudinally with the punch. Some of the metal tends to try to escape the movement of the punch by moving radially outward. This interaction tends to deform or puff the central region of the forging radially outward. Further, the longitudinal movement of the punch tends to suck or pull the upper part of the forging inward toward the bore. The inner forging periphery support surface of the split ring is defined with sufficient precision that any puffing of the forging is held within a 1.5 mm or other selected tolerance. The inward deformation adjacent the upper flange is countered by the interaction between the split ring and the trim die. The interaction between the split ring and the trim die tend to hold the flange and upper portion of the forging from being pulled inward. The simultaneous trimming of the flange and the bore places opposite and substantially cancelling deformation forces on the forging to maintain its dimensional stability more accurately.

The invention has been described with reference to the preferred and alternate embodiments. Obviously, modifications and alterations will occur to others upon reading and understanding the preceding detailed description of the preferred embodiment. It is intended that the invention be construed as including all such alterations and modifications insofar as they come within the scope of the appended claims or the equivalents thereof.

Having thus described the preferred and alternate embodiments of the invention, the invention is now claimed to be:

1. A method for concurrently trimming flashings from an outer surface and an internal bore of a forging, the method comprising:
   receiving the forging in a split ring;
   positioning the split ring and forging on a nest member assembly with the forging bore substantially perpendicular thereto;
   moving a punch through the forging bore while engagement between the forging and the split ring is provided, whereby enlargement of a central portion of the forging from the interaction between the punch and forging is restrained; and,
   trimming the outer forging flashing with a trim die which moves concurrently with the punch using an outer surface of the split ring as a guide, whereby the concurrent trimming of the outer forging flashing and bore flashing restrains the forging from being pulled inward by the interaction of the punch and the forging bore.

2. The method of trimming forgings as set forth in claim 1 wherein the outer forging surface flashing extends peripherally around the forging and wherein the step of trimming the outer forging flashing includes splitting the flashing in at least two places such that after the outer forging flashing is trimmed, it falls away in at least two pieces.

3. The method of trimming forgings as set forth in claim 1 wherein the punch and trim die are concentric.

4. The method of trimming forgings as set forth in claim 3 wherein the trim die is annular.

5. The forging trimming method as set forth in claim 1 wherein the trim die starts engaging the outer forging flashing when the punch has passed about half way through the forging passage.

6. A method of concurrently trimming a peripheral flange and an internal bore of a forging, the method comprising:
   supporting the forging flange and an outer peripheral surface of the forging with a split ring;
   supporting the forging add the split ring on a nest member assembly, the nest member assembly having a bore in alignment with the forging bore;
   moving a punch through the forging bore and concurrently moving a trim die through the forging flange to trim the forging bore and flange, whereby interaction of the punch and the forging are restrained by the split from enlarging a central portion of the forging outward and by the trim die and flange interaction from pulling the forging adjacent the flange into the bore.

7. The method of trimming forgings as set forth in claim 6 wherein the trim die moves in sliding engagement with an outer surface of the split ring, such that the split ring outer surface guides the movement of the trim die.

8. The method of trimming forgings as set forth in claim 7 wherein the flange is trimmed by an interaction between the trim die and split ring outer surface.

9. The method of trimming forgings as set forth in claim 8 wherein the trim die is annular with a cutting edge around its inner end and the split ring outer periphery is circular and has a hardened cutting edge therearound, whereby the flange is trimmed to a circular contour.

10. The method of trimming forgings as set forth in claim 9 further including the step of splitting a portion which is trimmed from the flange with cutting edges operatively connected with the trim die such that the trimmed flashing falls away in at least two pieces.

11. An apparatus for concurrently trimming flashings from an outer surface and an internal passage of a forging, the apparatus comprising:

a split support means for receiving the forging;

a nest member assembly for supporting the split support means and forging;

a punch which is mounted to move through the forging passage, the split support means providing support for the forging such that enlargement of a central portion of the forging from the interaction between the punch and forging is restrained; and, a trim die which is mounted to move concurrently with the punch for trimming the outer forging flashings concurrently with the trimming of the internal passage such that the concurrent interaction between the trim die and forging and between the punch and forging restrains the forging from being pulled inward toward the forging passage by the interaction of the punch with the forging.

12. An apparatus for concurrently trimming a peripheral flange and an internal bore of a forging, the forging having first and second end surfaces and a peripheral surface, the flange being disposed peripherally adjacent the first end surface and the forging bore extending generally between the first and second end surfaces, the apparatus comprising:

a split ring having a flange supporting surface for supporting the flange and an inner surface which generally conforms to the forging peripheral surface;

a nesting member assembly having a forging supporting surface which conforms generally with a forging second end surface, the nesting assembly supporting surface defining an aperture therethrough, such that the nesting member is adapted to support the forging with the forging bore aligned with the nesting assembly aperture, the nesting member assembly further defining a split ring supporting portion for supporting the split ring;

a punch disposed for longitudinal movement through forging bore into the nest assembly aperture to trim the forging bore; and, a trim die disposed for longitudinal movement concurrently with the punch to trim the flange.

13. The apparatus as set forth in claim 12 wherein the split ring has an outer peripheral trim die guide surface such that the split ring guide surface and trim die interact in a cutting relationship.

14. The apparatus as set forth in claim 13 wherein the split ring guide surface and the trim ring have hardened, interacting cutting edges.

15. The apparatus as set forth in claim 12 wherein the nesting assembly forging supporting surface is generally annular and has a hardened cutting edge surrounding the nesting assembly aperture for interacting with the punch to trim the bore.

16. The apparatus as set forth in claim 12 wherein the trim die is generally annular and has a hardened cutting edge for trimming the flange.

17. The apparatus as set forth in claim 16 wherein the trim die has at least one projecting cutting blade for splitting flashing trimmed from the flange.

18. The apparatus as set forth in claim 17 wherein the trim die includes at least two projecting cutting blades such that the trimmed flashing falls away in at least two pieces.

19. The apparatus as set forth in claim 12 wherein the split ring inner surface is generally cylindrical, the split ring trim die guide surface is generally cylindrical, the trim die has a generally circular cutting edge, and the punch has a generally circular cutting edge, whereby the flange is trimmed with a circular periphery and the bore is trimmed to be a substantially cylindrical.

20. The apparatus as set forth in claim 12 wherein the split ring includes first and second substantially identical die halves and pivot means for pivotally connecting the split ring die halves to facilitate opening and closing of the split ring.

* * * * *